(12) United States Patent  
Liebregts et al.

(10) Patent No.: US 7,924,403 B2
(45) Date of Patent: Apr. 12, 2011

(54) LITHOGRAPHIC APPARATUS AND DEVICE AND DEVICE MANUFACTURING METHOD

(75) Inventors: Paulus Martinus Maria Liebregts, Veldhoven (NL); Johannes Henricus Wilhelmus Jacobs, Eindhoven (NL); Tammo Uitterdijk, De Bilt (NL)

(73) Assignee: ASML Netherlands B.V., Veldhoven (NL)

( * ) Notice: Subject to any disclaimer, the term of this patent is extended or adjusted under 35 U.S.C. 154(b) by 429 days.

(21) Appl. No.: 11/330,401

(22) Filed: Jan. 12, 2006

(65) Prior Publication Data

US 2006/0158628 A1  Jul. 20, 2006

Related U.S. Application Data

(60) Provisional application No. 60/643,608, filed on Jan. 14, 2005.

(51) Int. Cl.
  *G03B 27/42* (2006.01)
  *G03B 27/52* (2006.01)
  *G03B 27/58* (2006.01)
  *G03B 27/32* (2006.01)

(52) U.S. Cl. ............... 355/53; 355/30; 355/72; 355/77

(58) Field of Classification Search .............. 355/30, 355/53, 72, 77
See application file for complete search history.

(56) References Cited

U.S. PATENT DOCUMENTS

| | | | |
|---|---|---|---|
| 3,573,975 A | 4/1971 | Dhaka et al. ............. 117/212 |
| 3,648,587 A | 3/1972 | Stevens ........................ 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............. 430/326 |
| 4,480,910 A | 11/1984 | Takanashi et al. ............. 355/30 |
| 4,509,852 A | 4/1985 | Tabarelli et al. |
| 5,040,020 A | 8/1991 | Rauschenbach et al. ....... 355/53 |
| 5,121,256 A | 6/1992 | Corle et al. .................. 359/664 |
| 5,610,683 A | 3/1997 | Takahashi ..................... 355/53 |
| 5,715,039 A | 2/1998 | Fukuda et al. |
| 5,825,043 A | 10/1998 | Suwa ......................... 250/548 |
| 5,900,354 A | 5/1999 | Batchelder .................. 430/395 |
| 6,191,429 B1 | 2/2001 | Suwa ......................... 250/548 |
| 6,236,634 B1 | 5/2001 | Lee et al. ..................... 369/112 |
| 6,600,547 B2 | 7/2003 | Watson et al. ................ 355/30 |
| 6,603,130 B1 | 8/2003 | Bisschops et al. .......... 250/492.1 |
| 6,952,253 B2 | 10/2005 | Lof et al. |
| 7,038,760 B2 | 5/2006 | Mulkens et al. |
| 7,075,616 B2 | 7/2006 | Derksen et al. |

(Continued)

FOREIGN PATENT DOCUMENTS

DE  206 607  2/1984

(Continued)

OTHER PUBLICATIONS

English Translation of WO 99/49504 (dated Sep. 30, 1999).*

(Continued)

*Primary Examiner* — Alan A Mathews
(74) *Attorney, Agent, or Firm* — Pillsbury Winthrop Shaw Pittman LLP

(57) ABSTRACT

A immersion lithographic apparatus is disclosed in which one or more liquid diverters are positioned in a space surrounded by a liquid confinement structure. A function of the liquid diverter(s) is to hinder the formation of one or more recirculation zones of immersion liquid which may lead to variations in refractive index of the immersion liquid in the space and thereby imaging errors.

25 Claims, 4 Drawing Sheets

U.S. PATENT DOCUMENTS

| | | | |
|---|---|---|---|
| 7,098,991 | B2 | 8/2006 | Nagasaka et al. |
| 7,292,313 | B2 * | 11/2007 | Poon et al. ............... 355/53 |
| 7,397,532 | B2 * | 7/2008 | Novak ..................... 355/30 |
| 7,589,821 | B2 * | 9/2009 | Hirukawa ................ 355/53 |
| 2002/0020821 | A1 | 2/2002 | Van Santen et al. ....... 250/492 |
| 2002/0163629 | A1 | 11/2002 | Switkes et al. ............ 355/53 |
| 2003/0030916 | A1 | 2/2003 | Suenaga |
| 2003/0123040 | A1 | 7/2003 | Almogy .................... 355/69 |
| 2003/0174408 | A1 | 9/2003 | Rostalski et al. |
| 2004/0000627 | A1 | 1/2004 | Schuster ................ 250/201.2 |
| 2004/0075895 | A1 | 4/2004 | Lin ........................... 359/380 |
| 2004/0109237 | A1 | 6/2004 | Epple et al. |
| 2004/0114117 | A1 | 6/2004 | Bleeker ..................... 355/53 |
| 2004/0118184 | A1 | 6/2004 | Violette |
| 2004/0125351 | A1 | 7/2004 | Krautschik |
| 2004/0136494 | A1 | 7/2004 | Lof et al. |
| 2004/0160582 | A1 | 8/2004 | Lof et al. ................... 355/30 |
| 2004/0165159 | A1 | 8/2004 | Lof et al. ................... 355/30 |
| 2004/0169834 | A1 | 9/2004 | Richter et al. |
| 2004/0169924 | A1 | 9/2004 | Flagello et al. |
| 2004/0180294 | A1 | 9/2004 | Baba-Ali et al. |
| 2004/0180299 | A1 | 9/2004 | Rolland et al. |
| 2004/0207824 | A1 | 10/2004 | Lof et al. |
| 2004/0211920 | A1 | 10/2004 | Derksen et al. ........... 250/492.1 |
| 2004/0224265 | A1 | 11/2004 | Endo et al. |
| 2004/0224525 | A1 | 11/2004 | Endo et al. |
| 2004/0227923 | A1 | 11/2004 | Flagello et al. |
| 2004/0239954 | A1 | 12/2004 | Bischoff ................... 356/635 |
| 2004/0253547 | A1 | 12/2004 | Endo et al. |
| 2004/0253548 | A1 | 12/2004 | Endo et al. |
| 2004/0257544 | A1 | 12/2004 | Vogel et al. ............... 355/30 |
| 2004/0259008 | A1 | 12/2004 | Endo et al. |
| 2004/0259040 | A1 | 12/2004 | Endo et al. |
| 2004/0263808 | A1 | 12/2004 | Sewell |
| 2004/0263809 | A1 | 12/2004 | Nakano ..................... 355/30 |
| 2005/0007569 | A1 | 1/2005 | Streefkerk et al. ......... 355/30 |
| 2005/0018155 | A1 | 1/2005 | Cox et al. .................. 355/30 |
| 2005/0018156 | A1 | 1/2005 | Mulkens et al. |
| 2005/0024609 | A1 | 2/2005 | De Smit et al. ............. 355/18 |
| 2005/0030497 | A1 | 2/2005 | Nakamura ................. 355/30 |
| 2005/0030506 | A1 | 2/2005 | Schuster |
| 2005/0036121 | A1 | 2/2005 | Hoogendam |
| 2005/0036183 | A1 | 2/2005 | Yeo et al. |
| 2005/0036184 | A1 | 2/2005 | Yeo et al. |
| 2005/0036213 | A1 | 2/2005 | Mann et al. |
| 2005/0037269 | A1 | 2/2005 | Levinson |
| 2005/0046813 | A1 | 3/2005 | Streefkerk et al. ......... 355/30 |
| 2005/0046934 | A1 | 3/2005 | Ho et al. ................... 359/380 |
| 2005/0048223 | A1 | 3/2005 | Pawloski et al. |
| 2005/0052632 | A1 | 3/2005 | Miyajima ................. 355/53 |
| 2005/0068499 | A1 | 3/2005 | Dodoc et al. ............. 353/10 |
| 2005/0068639 | A1 | 3/2005 | Pierrat et al. |
| 2005/0073670 | A1 * | 4/2005 | Carroll ..................... 355/77 |
| 2005/0084794 | A1 | 4/2005 | Meagley et al. |
| 2005/0094116 | A1 | 5/2005 | Flagello et al. ............ 355/53 |
| 2005/0094125 | A1 | 5/2005 | Arai ........................ 355/72 |
| 2005/0100745 | A1 | 5/2005 | Lin et al. |
| 2005/0110973 | A1 | 5/2005 | Streefkerk et al. |
| 2005/0117224 | A1 | 6/2005 | Shafer et al. |
| 2005/0122497 | A1 | 6/2005 | Lyons et al. |
| 2005/0122505 | A1 | 6/2005 | Miyajima ................. 355/72 |
| 2005/0132914 | A1 | 6/2005 | Mulkens et al. .......... 101/463.1 |
| 2005/0134817 | A1 | 6/2005 | Nakamura ................. 355/53 |
| 2005/0140948 | A1 | 6/2005 | Tokita ....................... 355/30 |
| 2005/0141098 | A1 | 6/2005 | Schuster |
| 2005/0146693 | A1 | 7/2005 | Ohsaki ..................... 355/30 |
| 2005/0146694 | A1 | 7/2005 | Tokita ....................... 355/30 |
| 2005/0151942 | A1 | 7/2005 | Kawashima ............... 355/30 |
| 2005/0190455 | A1 | 9/2005 | Rostalski et al. |
| 2005/0200815 | A1 | 9/2005 | Akamatsu ................. 353/53 |
| 2005/0213065 | A1 | 9/2005 | Kitaoka .................... 355/53 |
| 2005/0213066 | A1 | 9/2005 | Sumiyoshi ................ 355/53 |
| 2005/0217135 | A1 | 10/2005 | O'Donnell et al. |
| 2005/0217137 | A1 | 10/2005 | Smith et al. |
| 2005/0217703 | A1 | 10/2005 | O'Donnell |
| 2005/0219489 | A1 | 10/2005 | Nei et al. .................. 355/53 |
| 2005/0233081 | A1 | 10/2005 | Tokita ....................... 427/256 |
| 2005/0237504 | A1 * | 10/2005 | Nagasaka et al. ......... 355/53 |
| 2005/0259234 | A1 * | 11/2005 | Hirukawa et al. ......... 355/53 |
| 2005/0282405 | A1 | 12/2005 | Harpham et al. |
| 2006/0033892 | A1 | 2/2006 | Cadee et al. .............. 355/30 |
| 2006/0033898 | A1 | 2/2006 | Cadee et al. .............. 355/53 |
| 2006/0082746 | A1 | 4/2006 | Mertens et al. |
| 2006/0102849 | A1 | 5/2006 | Mertens et al. .......... 250/440.11 |
| 2006/0103817 | A1 | 5/2006 | Ten Kate et al. |
| 2006/0114445 | A1 | 6/2006 | Ebihara |
| 2006/0164616 | A1 * | 7/2006 | Okada ....................... 355/53 |
| 2006/0209414 | A1 | 9/2006 | Van Santen et al. |
| 2007/0263195 | A1 | 11/2007 | Nagasaka et al. |
| 2007/0263196 | A1 | 11/2007 | Hirukawa et al. |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 0 605 103 A1 | 7/1994 |
| EP | 0 834 773 A2 | 4/1998 |
| EP | 1039511 | 9/2000 |
| EP | 1 477 856 | 11/2004 |
| EP | 1-486-827 A2 | 12/2004 |
| EP | 1-489-462 A2 | 12/2004 |
| EP | 1-491-957 A2 | 12/2004 |
| EP | 1 494 079 A1 | 1/2005 |
| EP | 1-528-433 A2 | 5/2005 |
| EP | 1 571 697 A1 | 9/2005 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | A-5-304072 | 11/1993 |
| JP | 06-124873 | 5/1994 |
| JP | A-6-168866 | 6/1994 |
| JP | 07-132262 | 5/1995 |
| JP | 07-220990 | 8/1995 |
| JP | A 08-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-207711 A | 7/2004 |
| JP | A-2004-320016 | 11/2004 |
| JP | A-2004-320017 | 11/2004 |
| JP | 2005-012228 A | 1/2005 |
| JP | 2005-175176 | 6/2005 |
| JP | 2005-243686 A | 9/2005 |
| WO | WO 99/49504 | 9/1999 |
| WO | WO 02/091078 A1 | 11/2002 |
| WO | WO 03/077037 A1 | 9/2003 |
| WO | WO 03/085708 A1 | 10/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |

| | | |
|---|---|---|
| WO | WO 2004/081666 A1 | 9/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092830 A2 | 10/2004 |
| WO | WO 2004/092833 | 10/2004 |
| WO | WO 2004/093130 | 10/2004 |
| WO | WO 2004/093159 | 10/2004 |
| WO | WO 2004/093159 A2 | 10/2004 |
| WO | WO 2004/093160 | 10/2004 |
| WO | WO 2004/095135 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 | 3/2005 |
| WO | WO 2005/031823 A1 | 4/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

English Translation of WO 2004/053955 A1 (dated Jun. 24, 2004).*
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's 2003 Real Solutions", May 15, 2003.
H. Kawata et al., "Optical Projection Lithography using Lenses with Numberical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).
European Office Action issued for European Patent Application No. 06250136.6, dated Sep. 27, 2006.
European Search Report issued for European Patent Application No. 06250136.6—2222, dated Apr. 19, 2006.
Information Disclosure Statement for U.S. Appl. No. 11/878,076, dated Jul. 20, 2007.
Information Disclosure Statement for U.S. Appl. No. 11/878,075, dated Jul. 20, 2007.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Notice of Reasons for Rejection for Japanese Patent Application No. 2006-005942 dated Aug. 29, 2008.
Notice of Reasons for Rejection for Japanese Patent Application No. 2006-005942 dated Aug. 25, 2009.
Office Action dated Jul. 8, 2010 from European Application No. 06 250 136.6-2222.

* cited by examiner

Fig. 8a
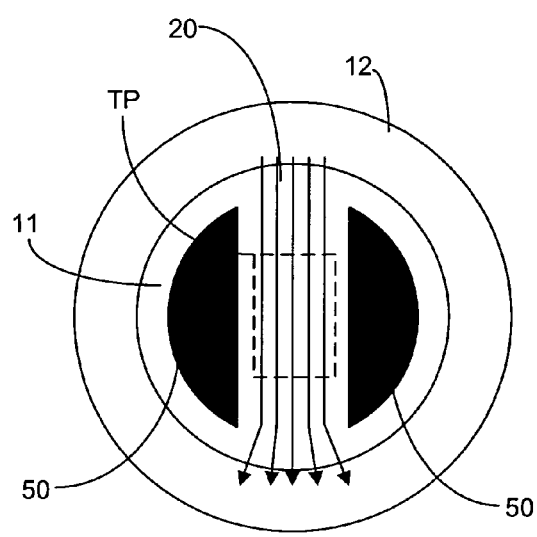
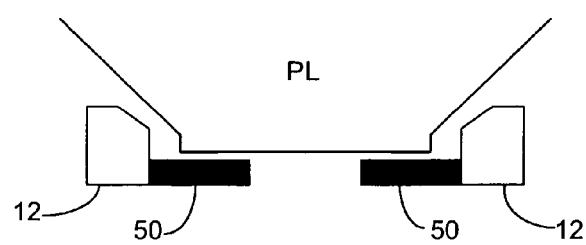
Fig. 8b
Fig. 9a
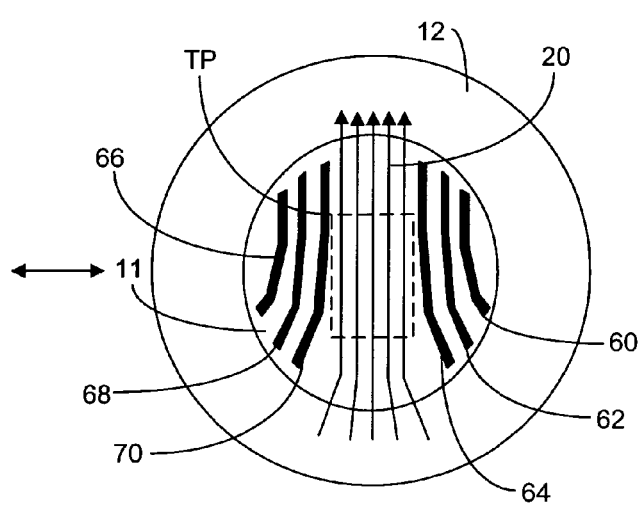
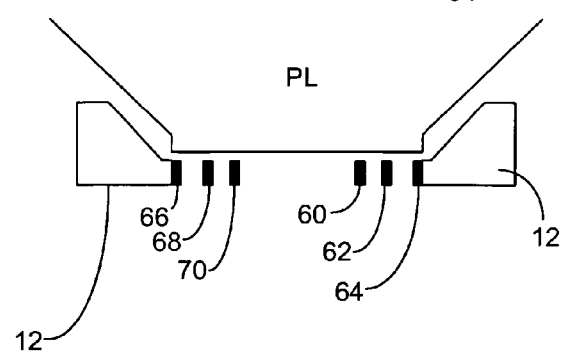
Fig. 9b

LITHOGRAPHIC APPARATUS AND DEVICE AND DEVICE MANUFACTURING METHOD

1. RELATED APPLICATIONS

This application claims priority to and benefit from U.S. Provisional Application No. 60/643,608, filed Jan. 14, 2005, the entire contents of which is hereby incorporated by reference.

2. FIELD

The present invention relates to a lithographic apparatus and a method for manufacturing a device.

3. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus). Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In an immersion lithographic apparatus, a temperature gradient in the immersion liquid may cause imaging defects because of the temperature dependency of the refractive index of the immersion liquid. A temperature gradient can arise because of absorption of the projection beam by the immersion liquid and/or because of heat transfer from other parts of the apparatus, for example the substrate or the liquid confinement system. Also, leaching of the resist into the immersion liquid and thereby transport of the resist onto the final element of the projection system may cause problems.

4. SUMMARY

Accordingly, it would be advantageous, for example, to provide an immersion lithography apparatus in which a temperature gradient in the immersion liquid is reduced or avoided.

According to an aspect of the invention, there is provided a lithographic projection apparatus arranged to project a pattern from a patterning device onto a substrate through a liquid confined to a space adjacent the substrate, the apparatus comprising a liquid diverter in the space to promote liquid flow across the space.

According to an aspect of the invention, there is provided a device manufacturing method, comprising projecting a patterned beam of radiation onto a substrate through a liquid provided in a space adjacent the substrate, wherein flow of the liquid across the space is promoted by a liquid diverter in the space.

5. BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6b illustrates in section the liquid supply system of FIG. 6a;

FIGS. 8a and 8b illustrate in plan and in section respectively a liquid supply system according to a further embodiment of the invention; and FIGS. 9a and 9b illustrate in plan and in section respectively a liquid supply system according to a further embodiment of the invention.

6. DETAILED DESCRIPTION

Figure 1:
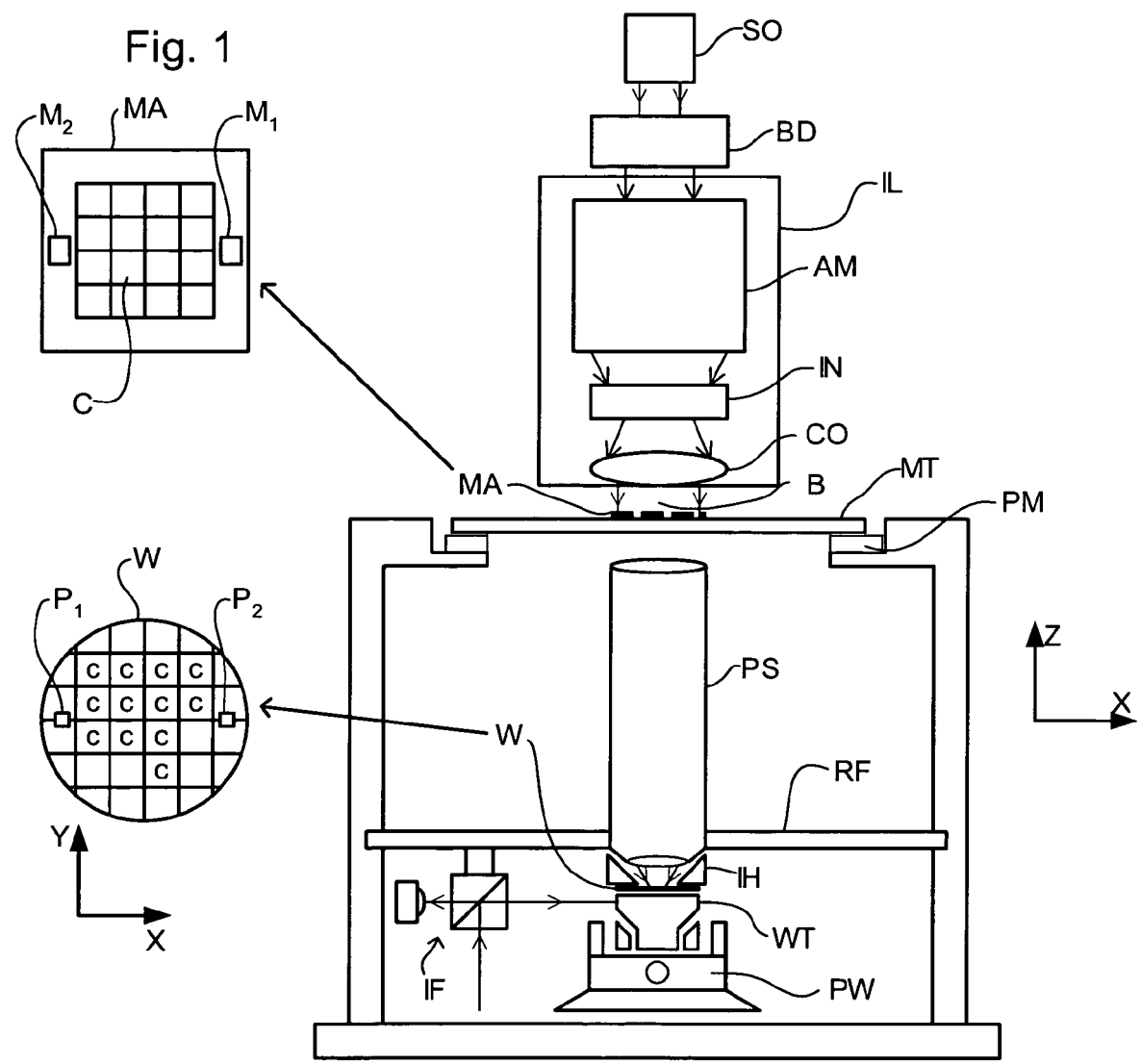
FIG. 1 depicts a lithographic apparatus according to an embodiment of the invention.
Figure 2:
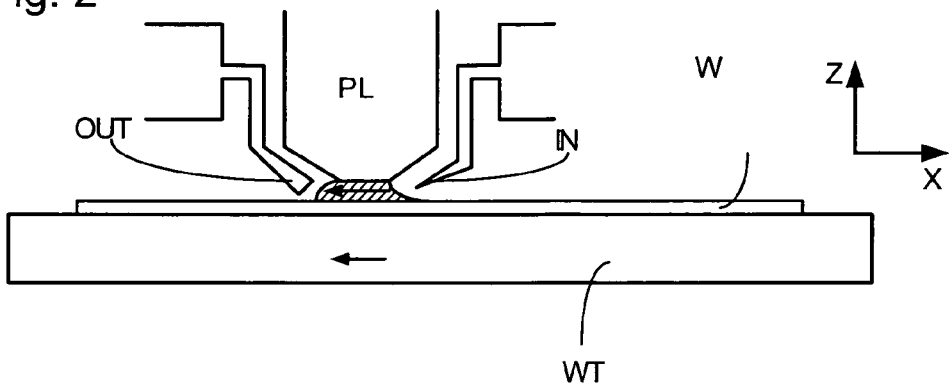
FIGS. 2 and 3 depict a liquid supply system for use in a lithographic projection apparatus.
Figure 3:
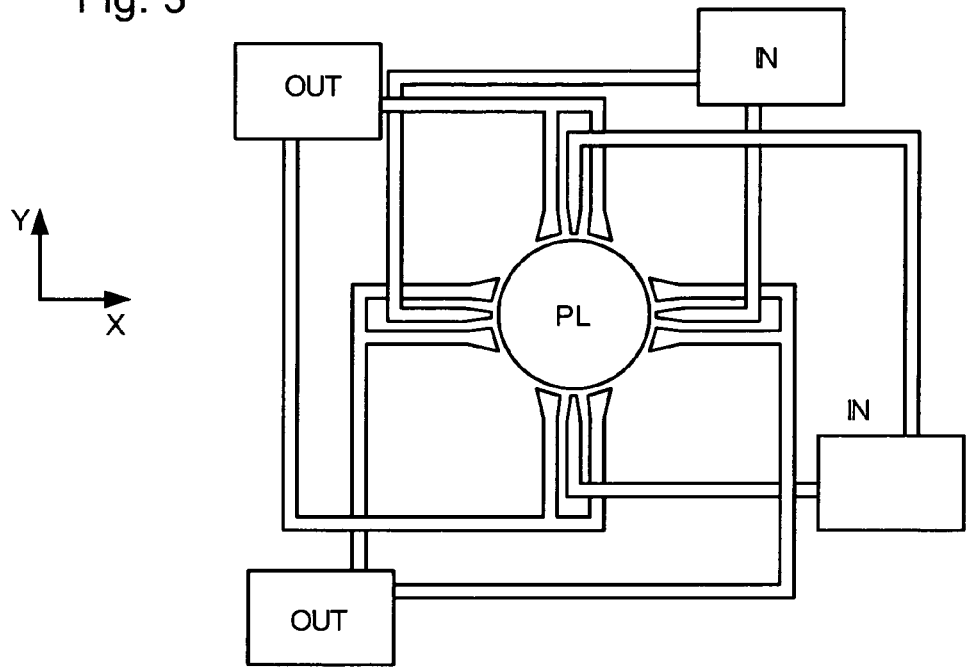

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
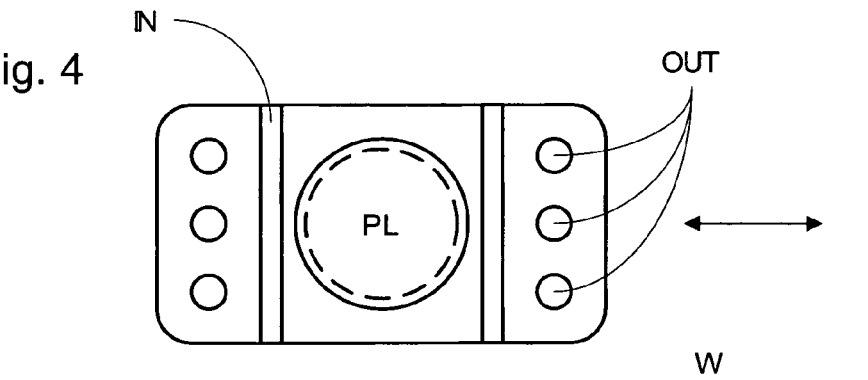
FIG. 4 depicts another liquid supply system for use in a lithographic projection apparatus.
Figure 4:
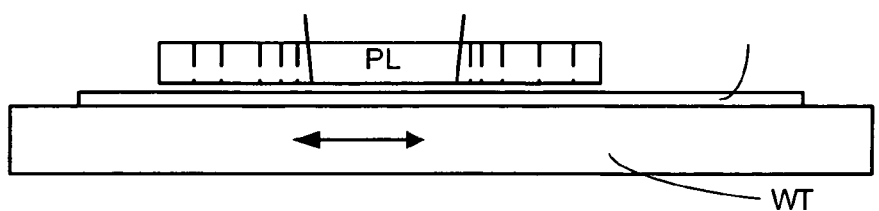

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
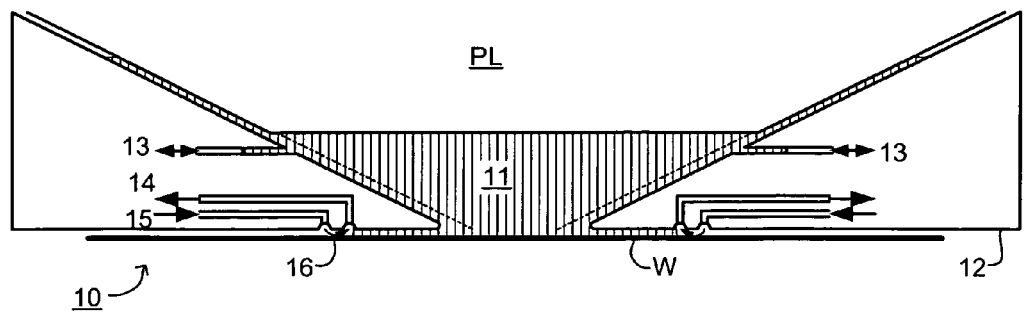
FIG. 5 depicts a further liquid supply system for use in a lithographic apparatus.

Another immersion lithography solution with a localized liquid supply system solution which has been proposed is to provide the liquid supply system with a liquid confinement structure which extends along at least a part of a boundary of the space between the final element of the projection system and the substrate table. An example of such a solution is illustrated in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705, 783, hereby incorporated in its entirety by reference.

FIG. 5 depicts an arrangement of a reservoir 11 of liquid confined to fill a space between the substrate's primary surface, which faces the projection system PL, and the final element of the projection system PL. A contactless seal to the substrate around the image field of the projection system facilitates to confine the liquid in the reservoir 11. A liquid confinement structure 12 positioned below and surrounding the final element of the projection system PL forms the reservoir. Thus, the liquid supply system 10 provides liquid on only a localized area of the substrate. The liquid confinement structure 12 forms part of the liquid supply system configured to fill a space between the final element of the projection system and the substrate W (or substrate table WT) with a liquid. Liquid is brought into the space below the projection system via, for example, inlet 13 and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case. The patterned beam passes through this aperture.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and the substrate W and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas. As with any seal, some liquid is likely to escape, for example up the outlet 14. European patent application publication no. EP 1477856 discloses an actuated liquid supply system in which the liquid confinement structure is free to move in the direction of the optical axis.

A potential problem with the liquid supply system of FIG. 5 is that one or more recirculation zones within the immersion liquid may form in the reservoir 11. Liquid which recirculates has more time to leach out resist from the substrate and thereby may have different (optical) properties than desired. Scan movements may transport one or more of these recirculation zones to the target portion TP where it may affect the projected image. Also, liquid which recirculates in the target portion may be heated by the patterned beam B more than liquid which is quickly replaced and because of temperature dependence of the refractive index of the immersion liquid, this may lead to imaging aberrations. Evaporation of immersion liquid may also occur and lead to cooling of the immersion liquid. Therefore, temperature control of the immersion liquid is a consideration.

One way to promote the flow of liquid through the space 11 (which in plan is smaller than the substrate) so that little or no recirculation takes place is to provide fluid to the space 11 only from one side of the liquid confinement structure 12 and to extract the liquid from the other side. The direction in which the liquid flows can be changed to follow the scan direction of the substrate and this can be achieved, for example, by rotating the liquid confinement structure 12 around the optical axis. One way of arranging for this would be to arrange for the liquid confinement structure 12 to be a rotor of a direct drive motor. This would result in low mass and could also advantageously be harnessed to support the liquid confinement structure 12 magnetically. This arrangement allows flow of immersion liquid through the space 11 from any direction at the expense of increased complexity. A controller may be used to anticipate changes in direction of scan (e.g. if the substrate meanders under the projection system PL) and the liquid confinement structure 12 may be rotated accordingly to ensure that the flow direction is correctly oriented relative to the direction that the substrate W is taking relative to the liquid confinement structure 12. Another way is to separate the space vertically by using dividers as is disclosed in the U.S. patent application Ser. No. 10/986,187, filed Nov. 12, 2004, hereby incorporated in its entirety by reference.

FIGS. 6 to 9 illustrate passive embodiments in which liquid flow diverters 50, 60, 62, 64, 66, 68, 70 promote the flow 20 of immersion liquid from one side of a liquid confinement structure 12 to the other side of the liquid confinement structure 12. In this way, laminar flow of immersion liquid through the space 11 may be promoted and thus recirculation of immersion liquid in the space 11 may be reduced or substantially hindered or prevented. In an embodiment, the flow 20 of immersion liquid through the space 11 is in a direction substantially perpendicular to the scan direction 100. However, this need not be the case and, in particular, while the substrate is moved from one row of target portions on the substrate W which have been imaged to the next row of target portions it may be that the path which the substrate W meanders under the projection system PL may result in the substrate W not moving in a direction perpendicular to the flow 20 of the immersion liquid. In a possible implementation, the embodiments of FIGS. 6 to 9 are entirely passive i.e. that they have no moving parts. However, it is possible to arrange for one or more of the liquid flow diverters 50, 60, 62, 64, 66, 68, 70 to be rotatable relative to the projection system PL and perhaps also to the liquid confinement structure 12 such that the direction of flow 20 of the immersion liquid through the space 11 relative to the projection system PL can be changed. This could be arranged for as discussed in the foregoing paragraph.

The embodiments of FIGS. 6 to 9 will now be described in detail and then general comments regarding the construction of the liquid flow diverters 50, 60, 62, 64, 66, 68, 70 will be described.

Figure 6A:
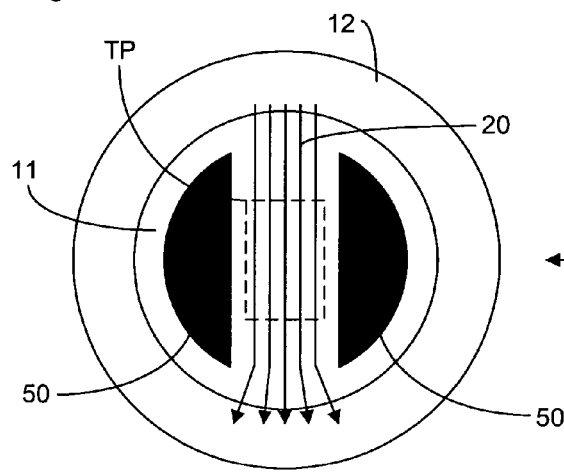
FIG. 6a depicts in plan a liquid supply system according to an embodiment of the invention.

FIG. 6a illustrates a liquid confinement structure 12 and liquid flow diverters 50 in plan. The liquid confinement structure 12 defines an inner space 11 which is filled with immersion liquid.

The flow diverters 50 are positioned on either side of a target portion TP on the substrate W. The target portion TP is the portion of the substrate W which is to be imaged. Thus the patterned beam B passes through an image field with the same cross-section as the target portion TP through the immersion liquid. The liquid flow diverters 50 are positioned on either side of that image field so that the patterned beam B has an unobstructed path to the substrate W through the immersion liquid. The region in the space 11 where recirculation should be avoided or minimized is this image field and the liquid diverters 50 are designed to promote laminar flow 20 of the immersion liquid through the space 11 in that image field. In the case of the embodiment of FIG. 6a, this is achieved by providing two shaped flow obstructing bodies 50 which have a substantial volume compared to the volume of the space 11 (for example, 20 percent of the volume of the space 11) and these have the effect of promoting immersion liquid flow across the space, in particular in the image field which is above a target portion TP and preventing or reducing recirculation and temperature disturbances from being generated (e.g. by scan movements or by surfaces with different temperatures). The diverters direct the immersion liquid through the gap between the two flow diverters 50 thereby promoting (laminar) flow from one side of the liquid confinement structure 12 to the other side. Additionally, the diverters may prevent or reduce transportation of disturbances to the target portion area and may also prevent or reduce the presence of recirculation areas on either side of the target portion.

Figure 6B:
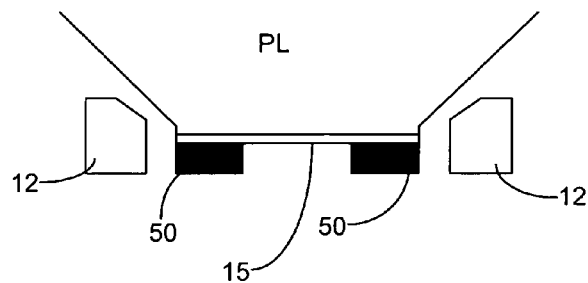

FIG. 6b illustrates the embodiment of FIG. 6a in cross-section. As can be seen in FIG. 6b, a final element 15 of the projection system PL supports the liquid flow diverters 50. The liquid flow diverters 50 may be integrally formed with the final element 15 (for example, be machined out of a block of a material along with the final element 15) or may be attached by some other means to the final element 15. The flow diverters 50 may not be integrally formed with the final element 15 but may advantageously be made of the same material as the final element 15 nonetheless. The liquid confinement structure 12 is supported in this embodiment independently of the liquid flow diverters 50 and perhaps also independently of the projection system PL.

Figure 7A:
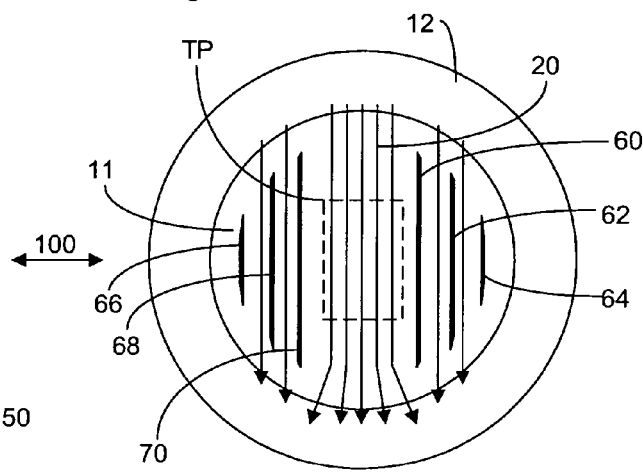
FIGS. 7a and 7b illustrate in plan and in section respectively a liquid supply system according to an embodiment of the invention.
Figure 7B:
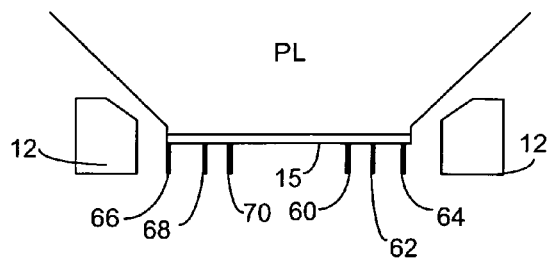

FIGS. 7a and 7b illustrate another embodiment of the present invention which is the same as the embodiment of FIG. 6a except as described below. In this embodiment the liquid flow diverters are in the form of a plurality of vanes or fins 60, 62, 64, 66, 68, 70 that replace liquid flow diverters 50 of the embodiment of FIG. 6a and also promote the flow of immersion liquid across the space 11. Immersion liquid flows between the vanes 60, 62, 64, 66, 68, 70 which are positioned on either side of the image field and have the same effect as the liquid diverters 50 of the embodiment of FIG. 6a in promoting laminar flow of immersion liquid in the image field and thereby preventing or reducing recirculation of immersion liquid. As can be seen in FIG. 6b, the vanes 60, 62, 64, 66, 68, 70 are also attached to the final element 15 of the projection system.

A further embodiment is illustrated in FIGS. 8a and 8b which is the same as the embodiment illustrated in FIG. 6a except as described below. In this embodiment the flow diverters 50 are attached to the liquid confinement structure 12 on an inner periphery of the liquid confinement structure 12 which at least partly defines the space 11. This embodiment is advantageous because the liquid confinement structure 12 may then move unhindered in the Z direction without any concern about the substrate W coming into contact with the flow diverters 50. The embodiment of FIG. 6a by contrast works best if the liquid confinement structure 12 is fixed in the Z direction and is not movable in the Z direction.

A further embodiment is illustrated in FIGS. 9a and 9b and is the same as the embodiment of FIG. 7a except as described below. In this embodiment, as can be seen from FIG. 9a, the vanes 60, 62, 64, 66, 68, 70 are curved and are not straight as in the embodiment of FIG. 7a. The precise shape of the liquid flow diverters 60, 62, 64, 66, 68, 70 is not vital, as with the liquid diverters 50, so long as the function of the flow diverters is to promote immersion liquid flow across the space thereby preventing or reducing recirculation. The shape illustrated in FIG. 9 where the main channel between two opposing sets of vanes decreases in cross-sectional area from the point at which immersion liquid enters the space 11 to that at which it exits the space (a converging channel) may be efficient at preventing or reducing recirculation zones within the image field because it may produce a stable flow.

As can be seen from FIG. 9b, this embodiment is similar to that of FIG. 8a in that the flow diverters are connected to the liquid confinement structure 12 and not to the projection system PL.

The configuration (e.g., curved or straight) or construction of the flow diverters 50, 60, 62, 64, 66, 68, 70 is not vital so long as they achieve the function of promoting flow of immersion liquid across the space thereby preventing or reducing flow recirculation. Further, the flow diverters may prevent or reduce temperature disturbances being generated in the space (e.g., generated by scanning movements and/or surfaces with different temperatures). The diverters may also prevent or reduce any such disturbances from being transported from the side of the space into the target portion TP. In an embodiment, the flow diverters have a surface treatment applied to them to promote laminar flow of immersion liquid past them. In an embodiment, the flow diverters are made out of a porous material which is effective to avoid pressure differentials between either side of the flow diverters. In addition, the diverters may be connected to a low pressure source and constructed and arranged to extract immersion liquid from one or more ports on the surface of the diverter thereby to remove the boundary layer of liquid from the surface of the diverter.

The flow diverters could be made solid. In an embodiment, the flow diverters may be hollow which has the advantage of reducing the weight, particularly in the embodiments where the flow diverters are attached to the liquid confinement structure 12. In an embodiment, the flow diverters are made of a material which is compatible with immersion liquid (i.e., not ion generating) and/or resistant to projection beam illumination. Example materials are stainless steel, ceramic or the same material as the final element of the projection system, such as quartz or calcium fluoride. Low thermal expansion materials such as Zerodur® or ULE® may also be suitable.

Thus it can be seen that the liquid diverters generally divert the immersion liquid in a direction substantially parallel to the plane of the substrate. This can be arranged to occur by making the liquid diverters extend in a direction perpendicular to the plane of the substrate. It can also be thought of as the liquid diverters having a vertical component to divide the space 11 in the horizontal plane (which is substantially parallel to the substrate W).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate through a liquid confined to a space adjacent the substrate using an optical element of a projection system, the apparatus comprising a liquid diverter configured to promote liquid flow in a flow direction substantially parallel to a plane of the substrate across the space, at least part of the liquid diverter, in use, located between the substrate and a surface, nearest the substrate and in contact with the liquid, of the optical element, located within an outer lateral boundary of the optical element, and extending in a direction substantially perpendicular to a plane of the substrate arranged to receive the pattern, the liquid flow being from at least one side of an exposure area of the substrate to another side of the exposure area and further away from the substrate than a surface of the liquid diverter adjacent the substrate.

2. The apparatus of claim 1, wherein the liquid diverter is configured to divert the liquid in a direction substantially parallel to the plane of the substrate.

3. The apparatus of claim 1, wherein the projected pattern is configured to be projected through an image field and a liquid diverter is positioned on each side of the image field.

4. The apparatus of claim 1, wherein the liquid diverter is an obstructing body with a substantial volume compared to the volume of the space.

5. The apparatus of claim 1, wherein the liquid diverter is configured to promote the liquid flow across the space from one side to an opposite side.

6. The apparatus of claim 4, wherein the liquid diverter is curved to promote the liquid to flow in a curved path.

7. The apparatus of claim 1, wherein the liquid diverter is attached to a final element of a projection system which is configured to project the patterned beam onto the substrate.

8. The apparatus of claim 1, wherein the liquid diverter is a vane with an elongate vertical cross-section.

9. The apparatus of claim 1, wherein the liquid diverter has an elongate horizontal cross-section.

10. The apparatus of claim 1, further comprising a liquid confinement structure configured to at least partly confine the liquid to the space and wherein the liquid diverter is attached to the liquid confinement structure.

11. The apparatus of claim 1, wherein the liquid diverter is hollow.

12. The apparatus of claim 1, wherein the liquid diverter is solid.

13. The apparatus of claim 1, wherein the liquid diverter is porous.

14. The apparatus of claim 1, wherein the liquid diverter has a surface finish to promote laminar flow of the liquid.

15. The apparatus of claim 1, comprising a plurality of liquid diverters.

16. The apparatus of claim 1, wherein the liquid diverter divides the space in a horizontal plane into separate channels.

17. The apparatus of claim 1, wherein the liquid diverter has an extraction port in a surface of the liquid diverter configured to remove a boundary layer of liquid from the surface of the liquid diverter.

18. A device manufacturing method, comprising projecting, using an optical element of a projection system, a patterned beam of radiation onto a substrate through a liquid provided in a space adjacent the substrate, wherein flow of the liquid across the space in a flow direction substantially parallel to a plane of the substrate is promoted by a liquid diverter, at least part of the liquid diverter located between the substrate and a surface, nearest the substrate and in contact with the liquid, of the optical element, located within an outer lateral boundary of the optical element, and extending in a direction perpendicular to a plane of the substrate arranged to receive the patterned beam, the liquid flow being from at least one side of an exposure area of the substrate to another side of the exposure area and further away from the substrate than a surface of the liquid diverter adjacent the substrate.

19. The method of claim 18, wherein the liquid diverter is attached to a final element of a projection system used to project the patterned beam onto the substrate.

20. The method of claim 18, further comprising at least partly confining the liquid to the space using a liquid confinement structure, the liquid diverter attached to the liquid confinement structure.

21. The method of claim 18, wherein the liquid diverter is a vane with an elongate vertical cross-section.

22. The method of claim 18, wherein the liquid diverter has an elongate horizontal cross-section.

23. The method of claim 18, wherein the liquid diverter divides the space in a horizontal plane into separate channels.

24. A lithographic projection apparatus arranged to project a pattern from a patterning device onto a substrate through a liquid confined to a space adjacent the substrate using an optical element of a projection system, the apparatus comprising a liquid diverter to promote liquid flow across the space, wherein the liquid diverter divides the space in a horizontal plane into separate vertical channels to promote the liquid flow across the space and at least part of the liquid diverter is, in use, located between the substrate and a surface, nearest the substrate and in contact with the liquid, of the optical element and located within an outer lateral boundary of the optical element.

25. A device manufacturing method, comprising projecting a patterned beam of radiation using an optical element of a projection system onto a substrate through a liquid provided in a space adjacent the substrate, wherein flow of the liquid across the space is promoted by a liquid diverter, wherein the liquid diverter divides the space in a horizontal plane into separate vertical channels to promote the liquid flow across the space and at least part of the liquid diverter is, in use, located between the substrate and a surface, nearest the substrate and in contact with the liquid, of the optical element and located within an outer lateral boundary of the optical element.

* * * * *

UNITED STATES PATENT AND TRADEMARK OFFICE
CERTIFICATE OF CORRECTION

| | |
|---|---|
| PATENT NO. | : 7,924,403 B2 |
| APPLICATION NO. | : 11/330401 |
| DATED | : April 12, 2011 |
| INVENTOR(S) | : Paulus Martinus Maria Liebregts et al. |

Page 1 of 1

It is certified that error appears in the above-identified patent and that said Letters Patent is hereby corrected as shown below:

On title page, item (54) Title and Col. 1
      replace "LITHOGRAPHIC APPARATUS AND DEVICE AND DEVICE MANUFACTURING METHOD" with --LITHOGRAPHIC APPARATUS AND DEVICE MANUFACTURING METHOD--.

Signed and Sealed this
Fourteenth Day of June, 2011

David J. Kappos
*Director of the United States Patent and Trademark Office*